United States Patent [19]
Dao et al.

[11] Patent Number: 5,302,477
[45] Date of Patent: Apr. 12, 1994

[54] INVERTED PHASE-SHIFTED RETICLE

[75] Inventors: Giang T. Dao; Ruben A. Rodriguez, both of Fremont; Harry H. Fujimoto, Sunnyvale, all of Calif.

[73] Assignee: Intel Corporation, Santa Clara, Calif.

[21] Appl. No.: 933,400

[22] Filed: Aug. 21, 1992

[51] Int. Cl.$^5$ .............................................. G03F 9/00
[52] U.S. Cl. ........................................ 430/5; 430/311; 430/312; 430/314; 430/322
[58] Field of Search ................... 430/5, 22, 269, 311, 430/322, 396, 312, 313, 314

[56] References Cited

U.S. PATENT DOCUMENTS

| | | | |
|---|---|---|---|
| 4,231,811 | 11/1980 | Somekh et al. | 148/1.5 |
| 4,890,309 | 12/1989 | Smith et al. | 378/35 |

FOREIGN PATENT DOCUMENTS

| | | |
|---|---|---|
| 0090924 | 8/1983 | European Pat. Off. . |
| 0395425 | 10/1990 | European Pat. Off. . |
| 0492630 | 12/1991 | European Pat. Off. . |
| 91/20018 | 12/1991 | PCT Int'l Appl. . |

OTHER PUBLICATIONS

Neureuther A. R., Sep. 26, 1990, BACUS Symposium, pp. 1-6.

Primary Examiner—Steve Rosasco
Attorney, Agent, or Firm—Blakely, Sokoloff, Taylor & Zafman

[57] ABSTRACT

A phase-shifted reticle with patterns proximate each other having inverted phases for the features and phase-shifting elements, and methods of fabricating the reticle, are disclosed. In a preferred embodiment, the inverted reticle is used to form an array of closely spaced contact or via openings. For a first pattern on the reticle, the feature will be the 0° phase and the phase-shifting rim surrounding that feature will be the 180° phase. All patterns surrounding the first pattern have phase-shifting rims of the 0° phase and features of the 180° phase. In this way, each pattern can form below conventional resolution features in the resist. Additionally, there will not be exposure of the regions between the closely spaced features since radiation transmitted through the closely spaced phase-shifting rims of the two patterns is 180° out of phase.

21 Claims, 12 Drawing Sheets

FIG _ 3A (PRIOR ART)
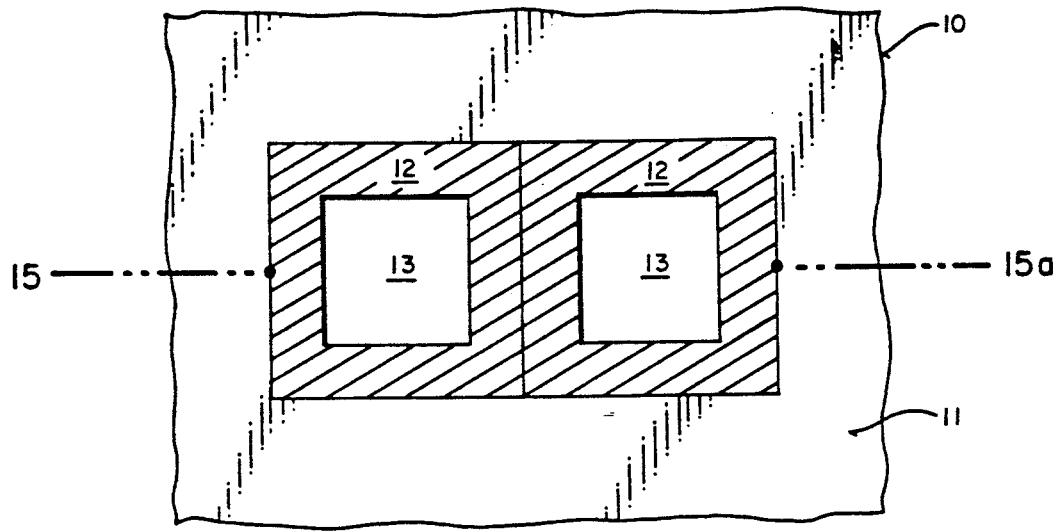
FIG _ 3B
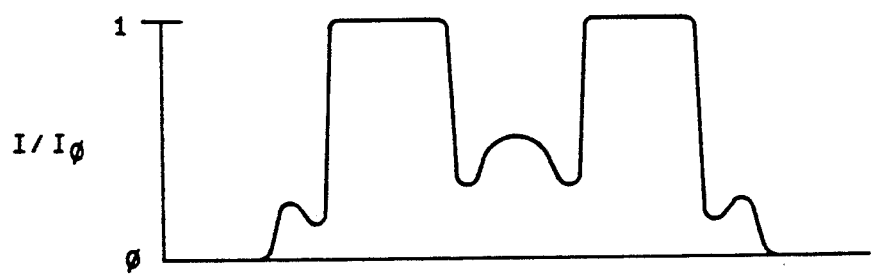

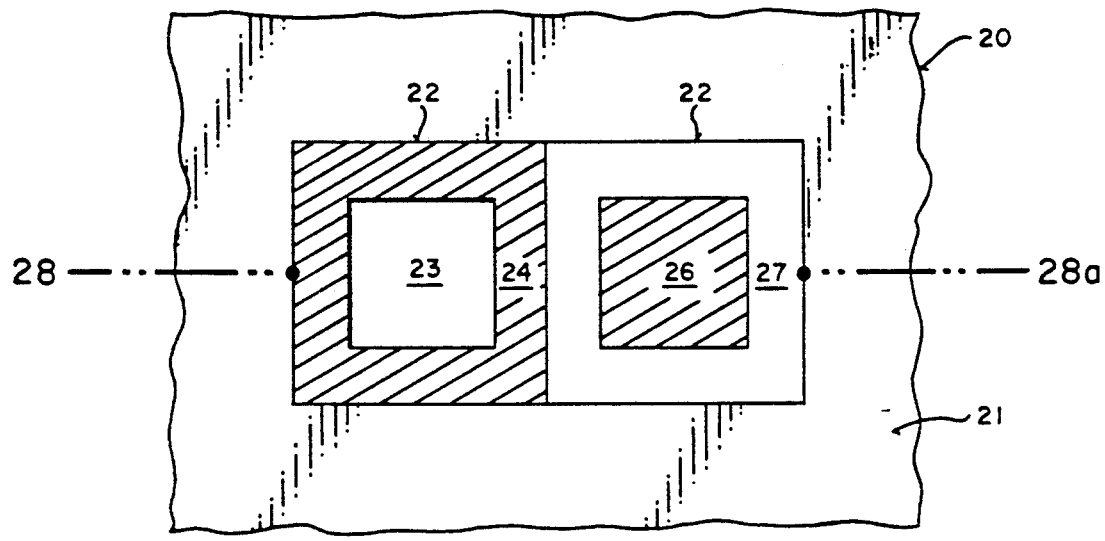
FIG_4A
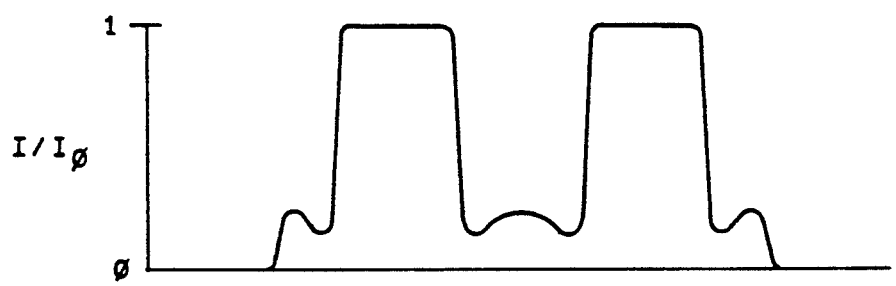
FIG_4B

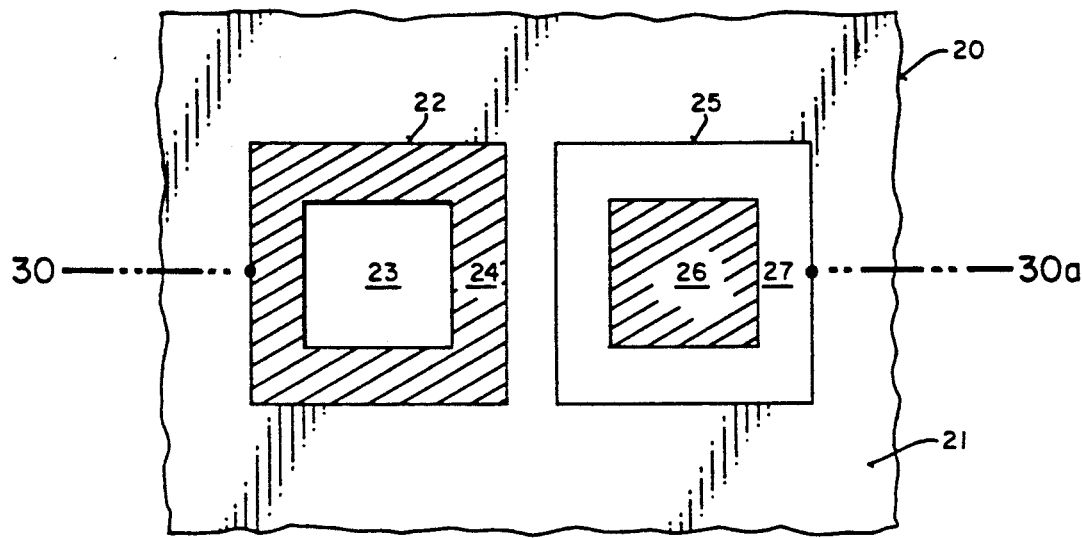
FIG_5A
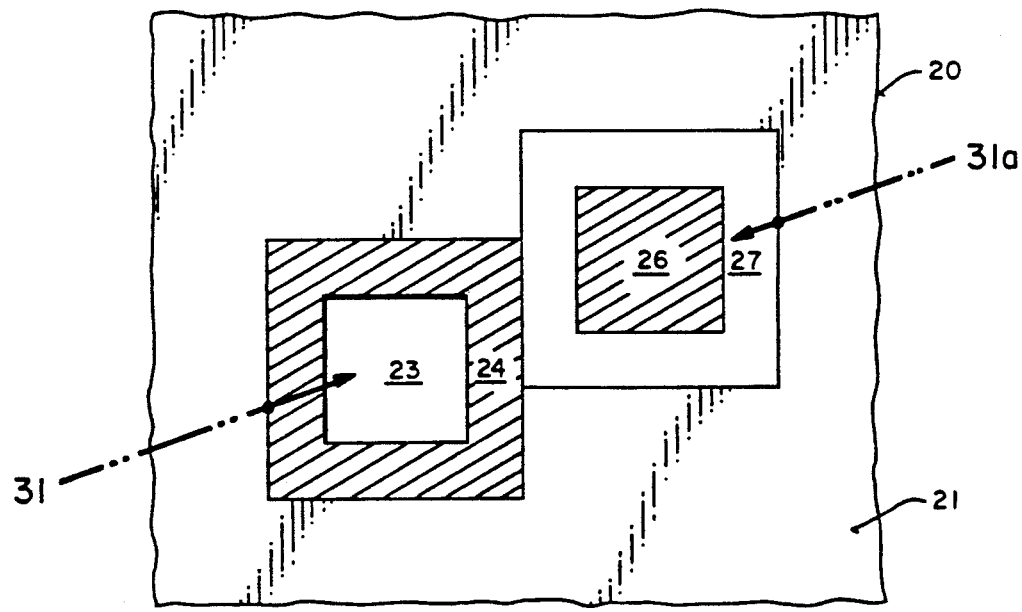
FIG_5B

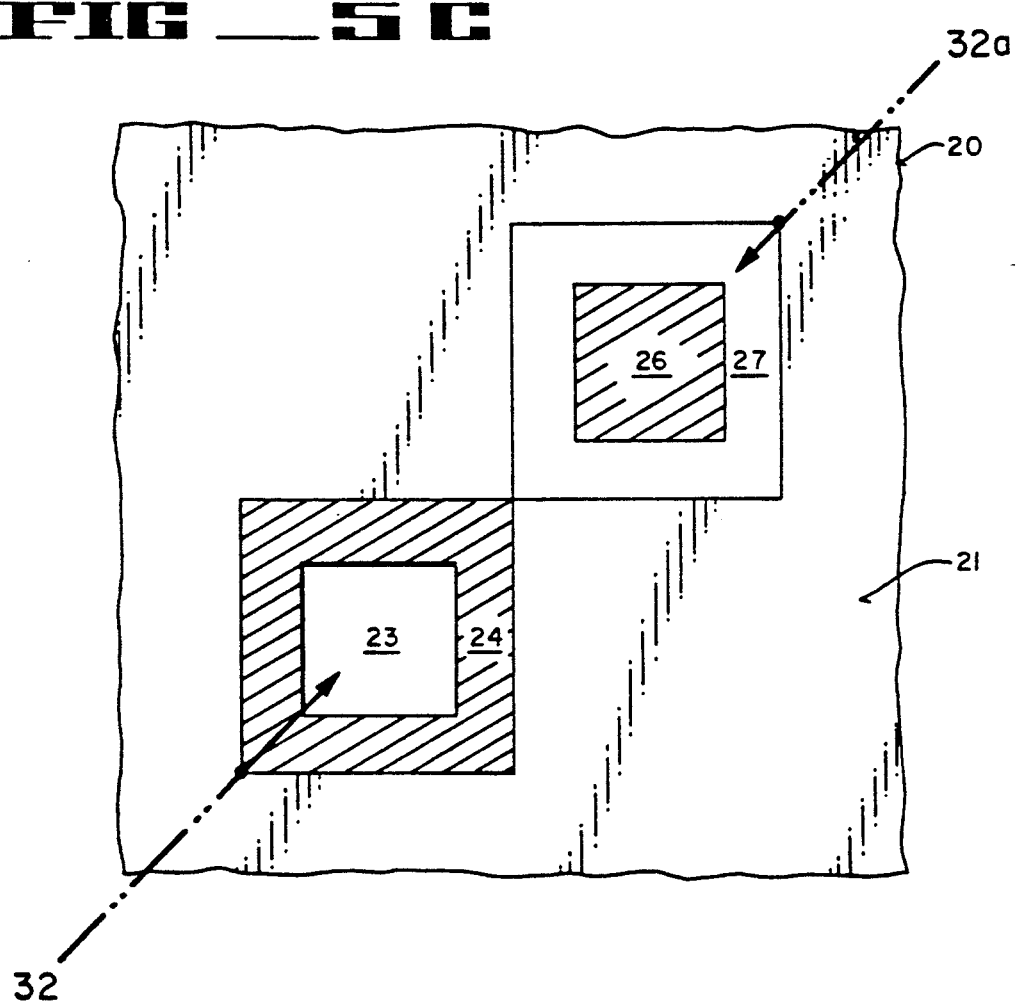
FIG_5C

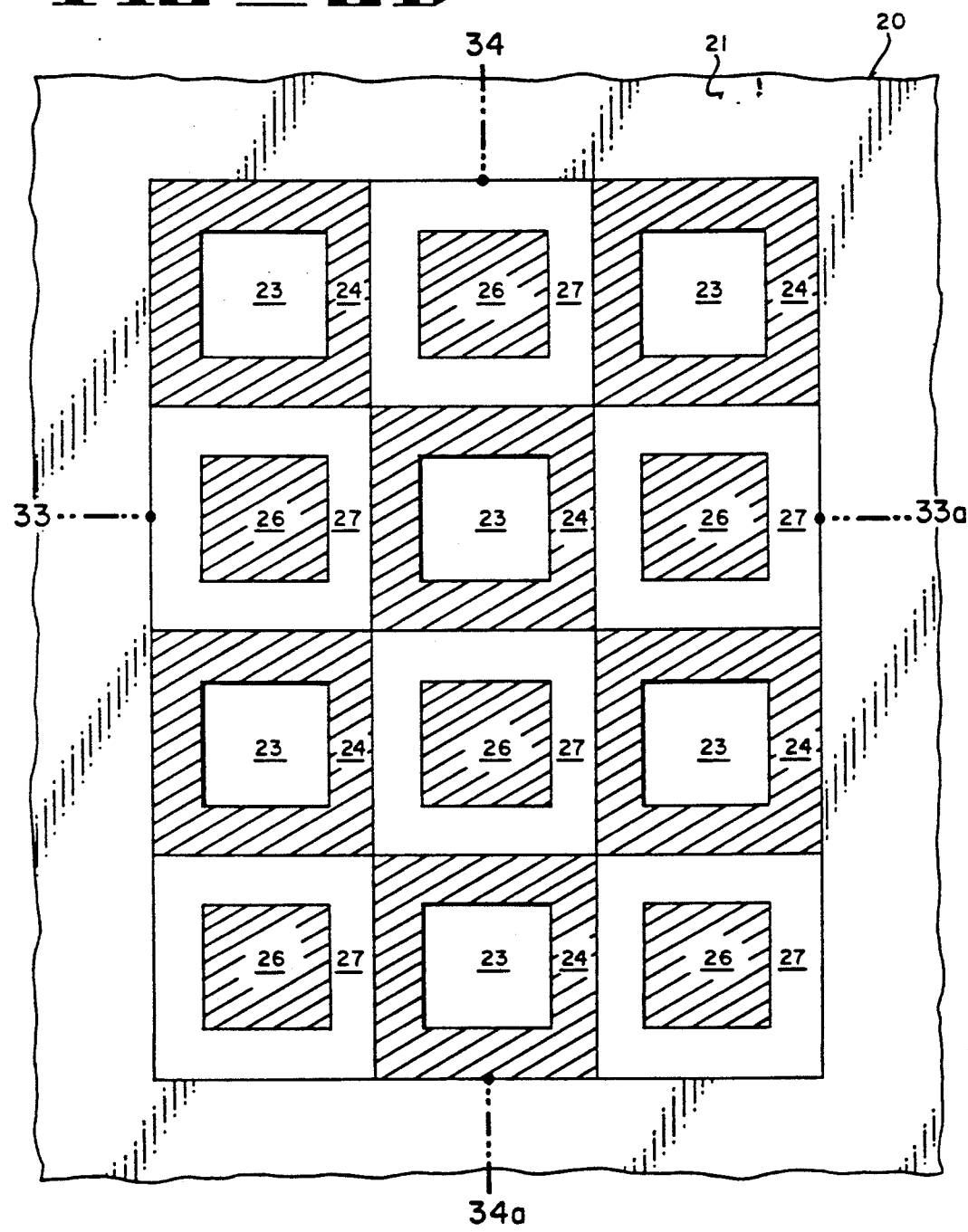

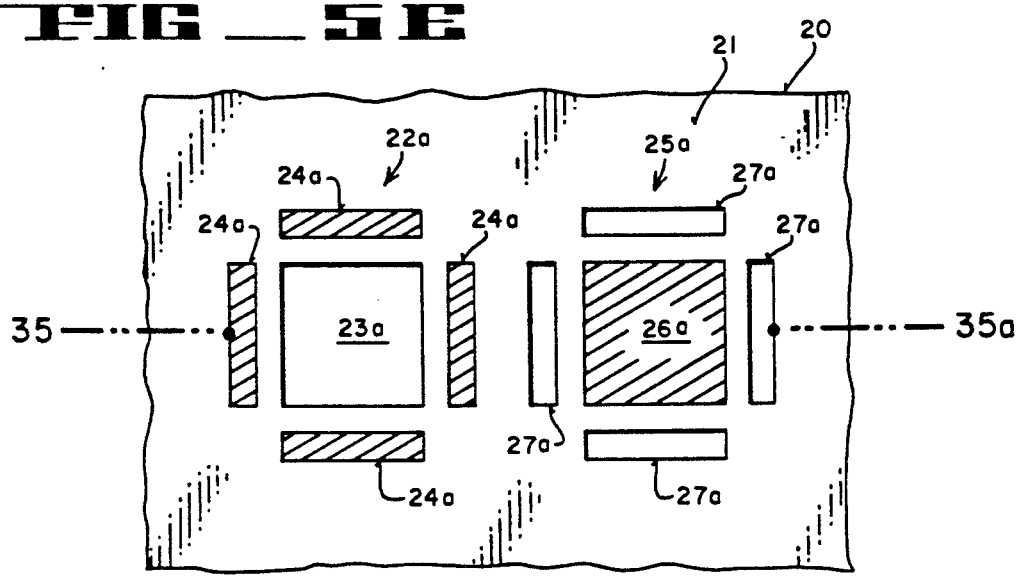
FIG_5E
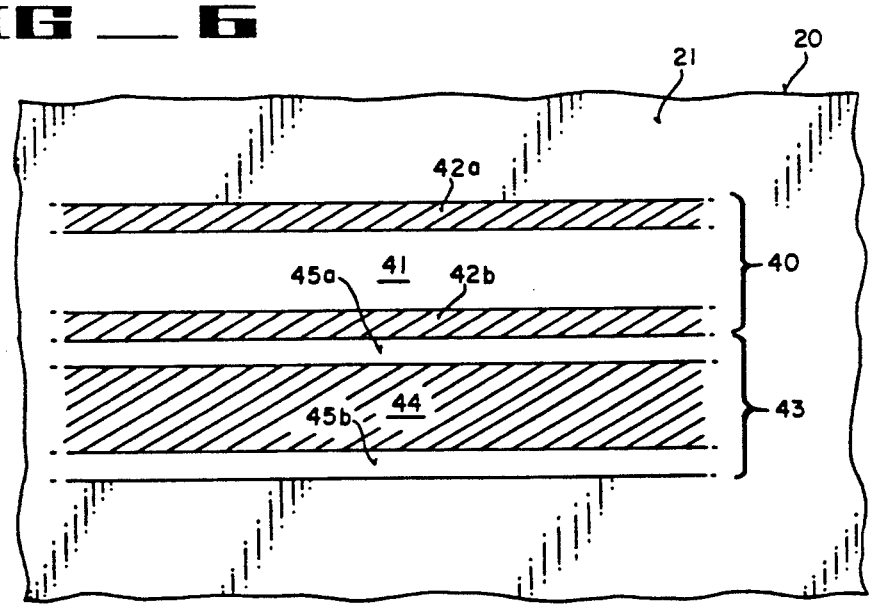
FIG_6

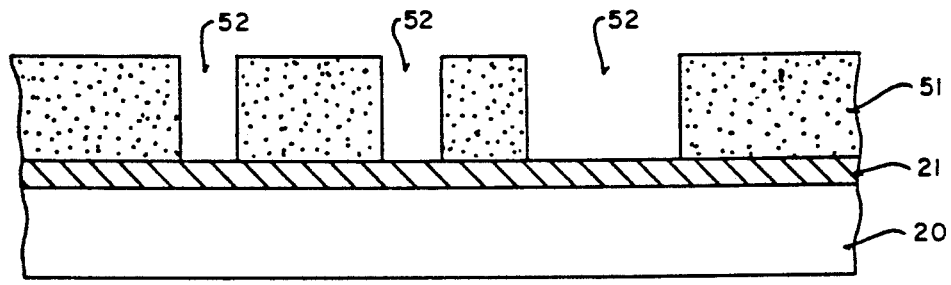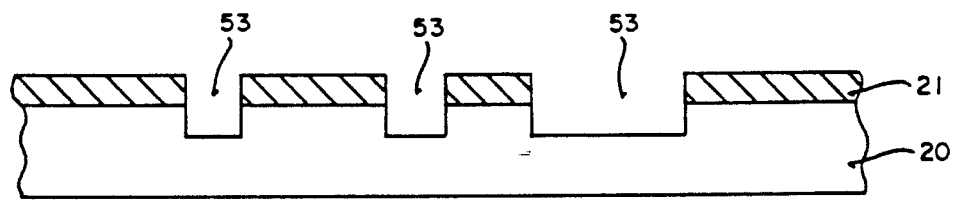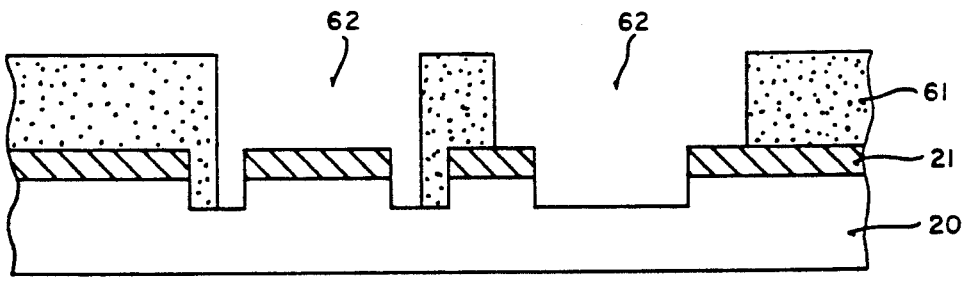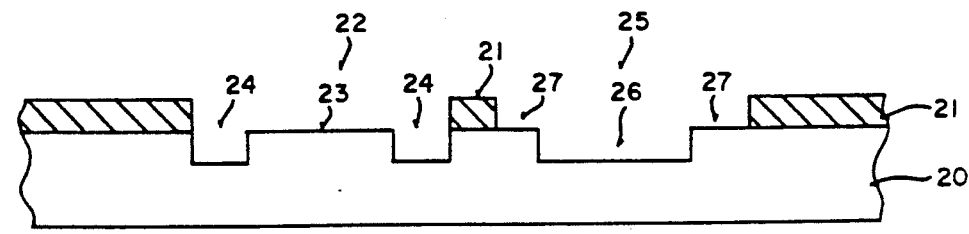

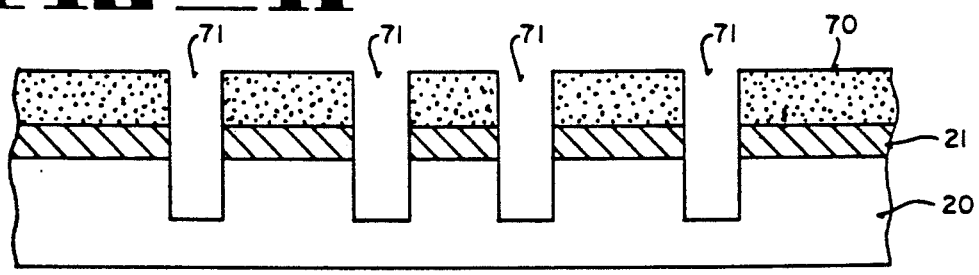
FIG_11
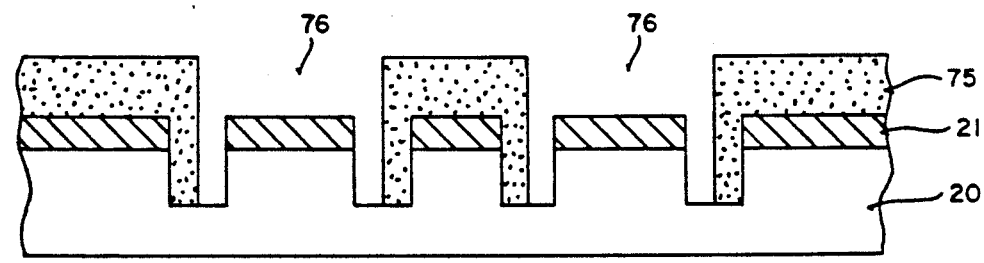
FIG_12
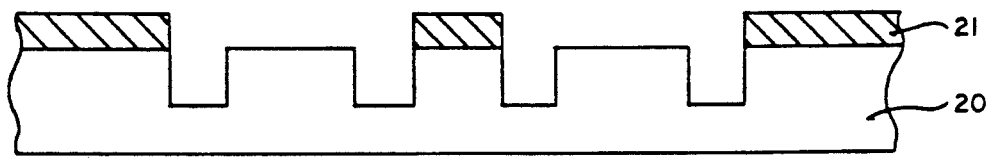
FIG_13
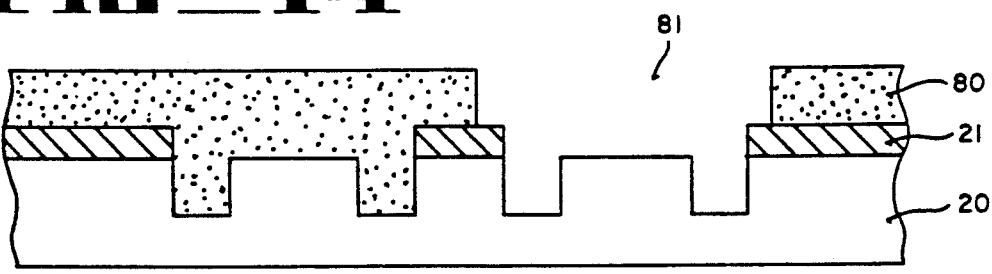
FIG_14
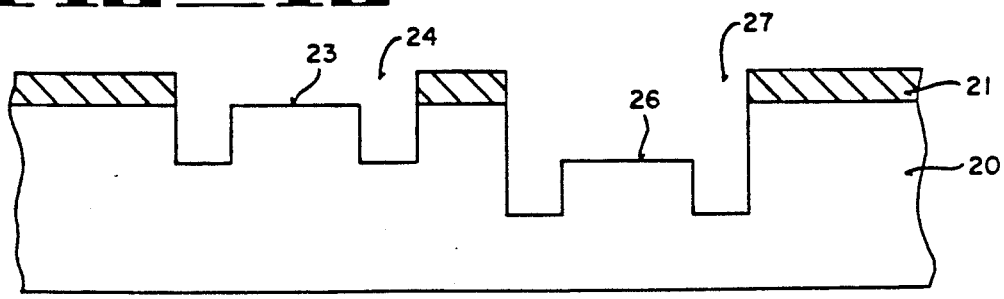
FIG_15

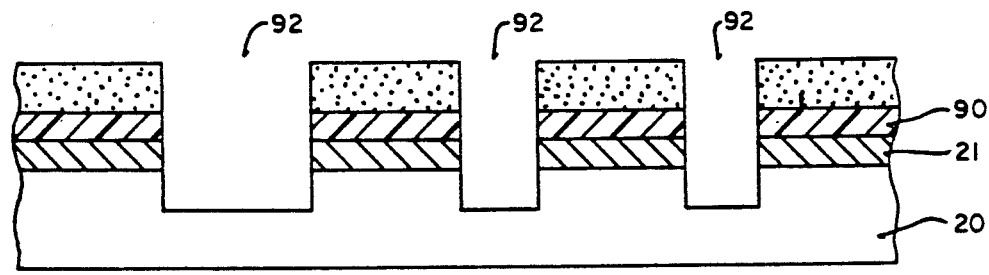
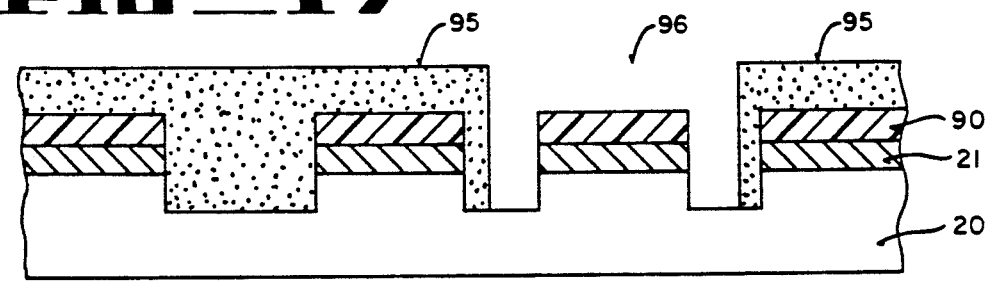
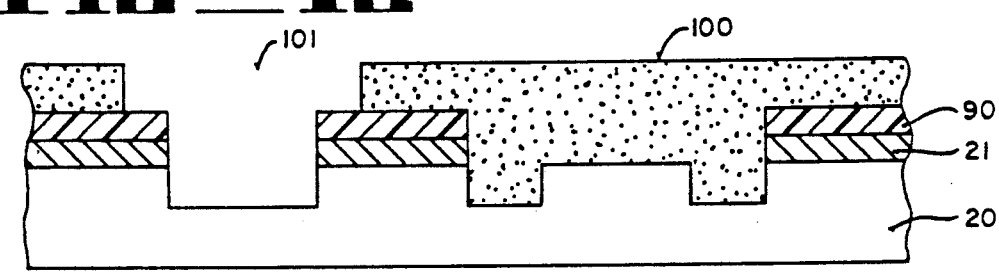
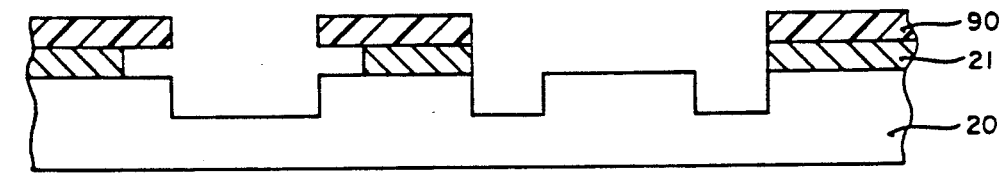
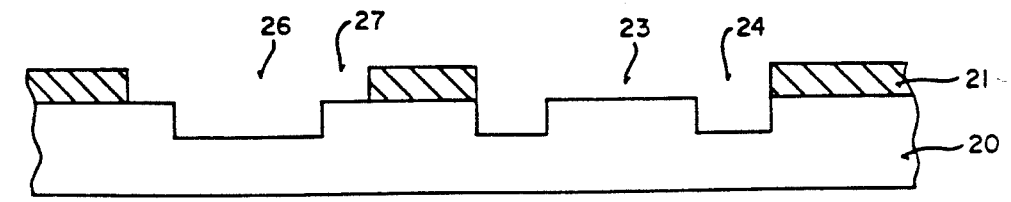

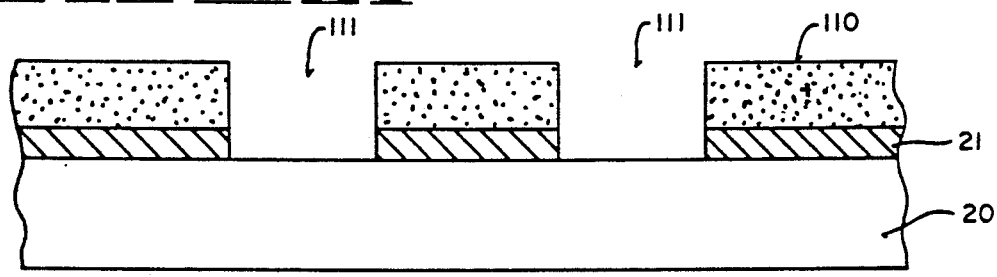
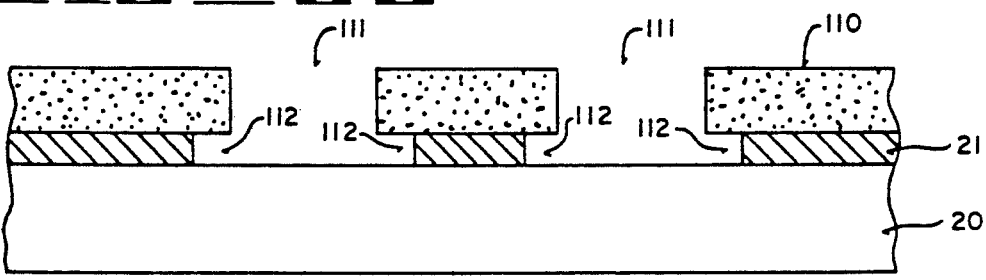
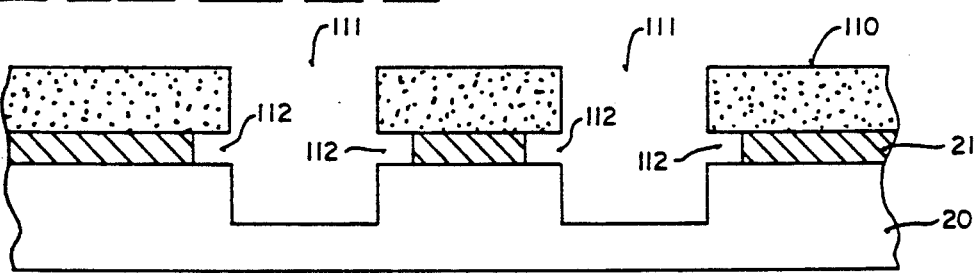
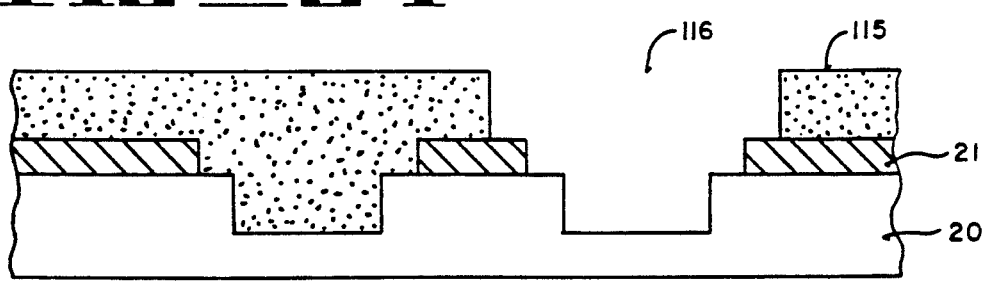
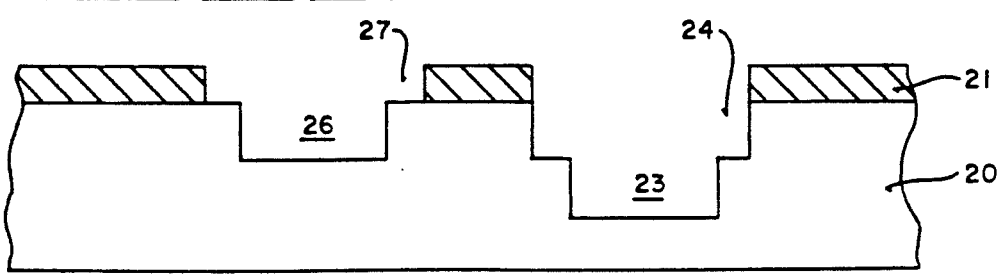

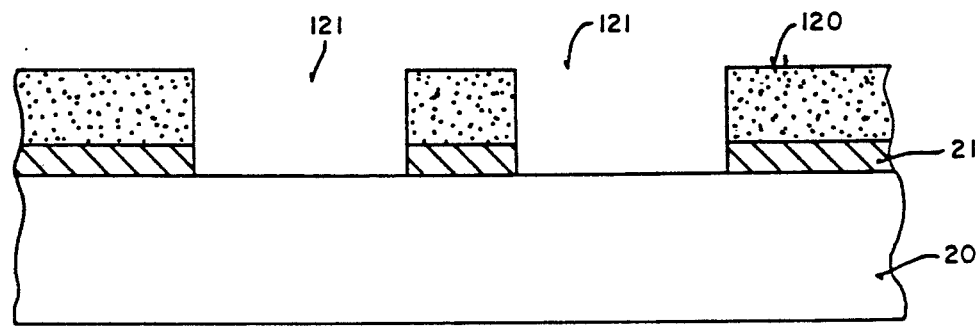
FIG_26
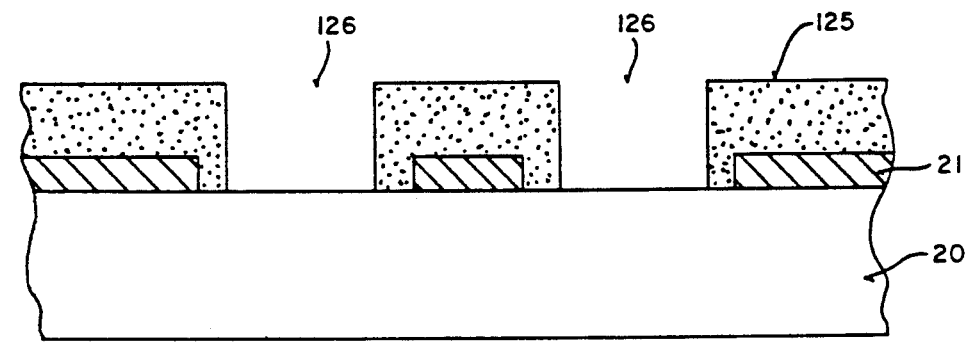
FIG_27
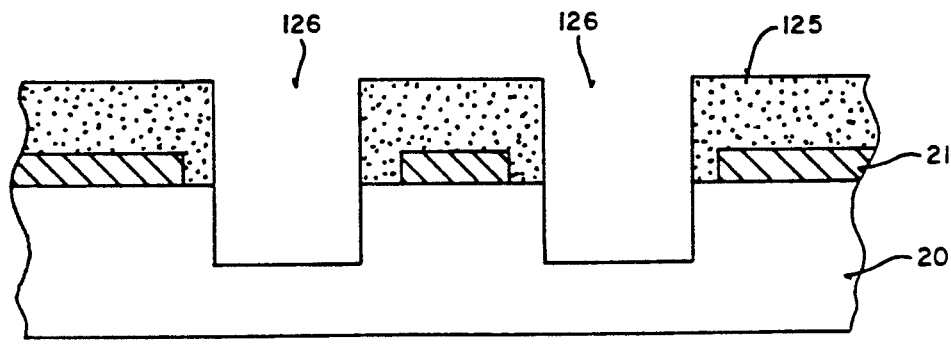
FIG_28

INVERTED PHASE-SHIFTED RETICLE

FIELD OF THE INVENTION

The present invention relates to the field of semiconductor devices, and in particular, to a reticle having a plurality of patterns with phase-shifting elements.

BACKGROUND OF THE INVENTION

Within the semiconductor industry, lithographic printers use reticles (also called masks) having device patterns to pattern photoresist layers. The reticle comprises a substrate, typically quartz, with an opaque layer, e.g., chrome, thereon. State of the art semiconductor devices require very small dimensional patterns. These small patterns can be formed within a photoresist layer as long as the pattern is within the resolution of the printer, which is herein defined as the smallest dimension that can be resolved within the photoresist layer while maintaining an acceptable process window. The practical resolution is approximately:

$$k_1 \frac{\lambda}{NA}$$

where $k_1$ is a "constant" for a given lithographic process (process constant), $\lambda$ is the wavelength of the radiation, and NA is the numerical aperture of the lens. One skilled in the art appreciates that $k_1$ is not a true constant, but can actually vary. A conventional reticle has a $k_1$ of approximately 0.8.

When exposing a feature having a dimension near the practical resolution with a conventional reticle, diffraction effects become significant. Because of this, portions of the photoresist underneath an opaque section near the interface of the opaque section and an opening in the reticle receive some of the exposing radiation. In order to minimize this problem, phase-shifted reticles have been used in the prior art.

In the following discussion a phase-shifted reticle used to pattern a positive photoresist will be used for illustration. Portions of the chrome layer will be referred to as "chrome elements." "Openings" within the chrome layer are regions from which the chrome layer has been removed, which transmit a substantial fraction of the exposing radiation, and which correspond to the pattern to be formed on the photoresist layer. "Phase-shifting elements" are regions between the chrome elements and openings from which the chrome has been removed and which transmit a substantial fraction of the exposing radiation, but shift the phase of the radiation approximately 180° relative to the opening. Generally, the phase difference of 180° between the opening and a phase-shifting element is created by a difference in the thickness of the quartz substrate between the two regions, or by the addition of a thickness of a material such as spin-on-glass (SOG), for example. A typical prior art phase-shifted reticle is shown in FIG. 1 and includes quartz plate 10 having chrome element 11, phase-shifting rim 12, and opening 13. A phase-shifting rim is a phase-shifting element which surrounds an opening such as opening 13. A "pattern" on a reticle as used herein is that portion of the reticle which forms an image in the developed photoresist pattern. In prior art non phase-shifted reticles, the pattern on a reticle consists of the opening in the chrome layer. In a phase-shifted reticle, the pattern consists of both the opening as well as any phase-shifting element associated with the opening. For example, the pattern shown in FIG. 1 comprises opening 13 and phase-shifting rim 12. The pattern formed by the portion of a reticle shown in FIG. 1 could be a contact or via opening. This pattern will be referred to as an "opening pattern" in the present specification.

Within this application, a phase-shifting element width is sometimes expressed as a fraction of IRF.$\lambda$/NA where IRF is the image reduction factor of the lens, $\lambda$, is the wavelength of the radiation, and NA is the numerical aperture of the lens. Widths expressed in units of IRF.$\lambda$/NA are used because the actual width of a phase-shifting element varies based on those three parameters. Although $k_1$ is a function of the phase-shifting element width, an equation to determine $k_1$ given a phase-shifting element width is not known. Generally, $k_1$ decreases as the phase-shifting element width increases, but it is understood that $k_1$ may not be a linear function of the phase-shifting element width. Therefore, an increased phase-shifting element width results in a decreased value of $k_1$, allowing for improved resolution. However, at least one process complication occurs. With an increased phase-shifting element width, the radiation intensity at the photoresist surface under the phase-shifting element increases. This can cause undesired exposure of the photoresist under the phase-shifting element. When the prior art phase-shifted reticle has a phase-shifting element with a width greater than about 0.4 IRF.$\lambda$/NA, the phase-shifting element is too wide, and the photoresist layer under the center of the phase-shifting element is substantially exposed when the reticle is exposed to radiation. The phase-shifting element width is usually no less than about 0.1 IRF.$\lambda$/NA because $k_1$ for a phase-shifting element width less than 0.1 IRF.$\lambda$/NA is close to the same value as $k_1$ for the conventional reticle.

In FIG. 1, the phase-shifting rim 12 has a thickness such that radiation transmitted through the phase-shifting rim 12 is shifted about 180° out of phase relative to the radiation transmitted through the opening 13. The transmittance of radiation transmitted through the opening 13 is about the same as the transmittance of radiation transmitted through the phase-shifting rim 12.

The phase-shifted reticle is used to pattern a positive photoresist layer as illustrated in FIGS. 2A, 2B, and 2C. FIG. 2A includes a cross-sectional view of the reticle of FIG. 1 and has quartz plate 10, chrome element 11, phase-shifting rim 12, and reticle opening 13. When radiation is incident on the reticle, the radiation is transmitted through the reticle opening 13 and the phase-shifting rim 12, but the chrome element 11 prevents virtually all transmission of radiation. FIG. 2B illustrates how the radiation transmitted through the reticle divided by the radiation incident on the reticle, $I/I_0$, may vary across the photoresist layer surface when using the reticle of FIG. 1. As seen in FIG. 2B, $I/I_0$ under the chrome element 11 is substantially zero, and $I/I_0$ under opening 13 away from the phase-shifting rim 12 is close to unity.

Interference areas A21 and A22 each include a portion of the phase-shifting rim 12 as shown in FIG. 2A. Within each interference area, the radiation transmitted through the phase-shifting rim 12 is shifted about 180° out of phase relative to the radiation transmitted through the reticle opening 13. Radiation from the reticle opening 13 that enters the interference areas is interfered with by the radiation that is transmitted through the phase-shifting rim 12 within the interference areas.

The actual patterned photoresist layer typically has at least one problem. As seen in FIG. 2B, some radiation reaches the photoresist layer under the phase-shifting rim 12. $I/I_0$ beneath the center of the phase-shifting element increases as the width of the phase-shifting element increases. After developing, the photoresist layer has resist elements 18 each with a recession 23 near a photoresist layer opening 22 as shown in FIG. 2C. To solve the problem of the recession caused by the prior art reticle of FIG. 1, a phase-shifted reticle having phase-shifting elements with a reduced transmittance has been discovered. See co-pending U.S. patent application Ser. No. 869,026; filed Apr. 15, 1992; entitled "Lithography Using A Phase-Shifted Reticle With Reduced Transmittance," which application is assigned to the assignee of the present invention.

As dimensions are scaled for increased device density, the dimensions and spacing of contact patterns such as those shown in FIG. 1 can be expected to decrease. A problem will be encountered with the prior art rim phase-shifted reticle of FIG. 1 for forming contact openings of small dimensions on scaled devices. Often, it is desired to put the contacts in an array. In an array, two opening patterns may be in close proximity, or may be adjacent to one another along a side. In this case, the two close or adjacent phase-shifting rims are roughly equivalent to one very wide rim. As noted above, as the phase-shifting rim width is increased, $I/I_0$ underneath the phase-shifting element increases. FIG. 3 shows a reticle with two prior art phase-shifting opening patterns placed side by side. FIG. 3B shows a plot of $I/I_0$, plotted along the line 15-15$a$ of FIG. 3A, showing the intensity of the exposing radiation at the photoresist surface. At the outer edges near the points 15 and 15$a$, the destructive interface between phase-shifting rim 12 and opening 13 has significantly reduced the transmitted light intensity. However, the intensity of radiation between the openings 13 is significantly higher. The increased intensity will cause a deep recession in the exposed photoresist, and may in fact cause a portion of the photoresist to be removed between the contact or via openings. Ibis problem occurs not only when two patterns are adjacent along a side as shown in FIG. 3A, but also when the patterns are in close proximity to one another. Even if a strip of chrome is between the two adjacent phase-shifted rim opening patterns, the increased intensity between the two patterns will still be too great if they are positioned at approximately 0.55 $\lambda$/NA or less.

What is needed is a phase-shifted reticle allowing for patterns having a phase-shifting rim or phase-shifting element along one or more sides to be placed closely together without causing an unacceptable increase in the exposure intensity between the patterns.

SUMMARY OF THE INVENTION

A phase-shifted reticle having closely spaced features with phase-shifting elements is disclosed. In a preferred embodiment, the phase-shifted reticle of the present invention comprises a plurality of rim phase-shifted opening patterns in a closely spaced array. The opening and phase-shifting rim of each pattern is inverted with respect to all adjacent contact patterns. Thus, if a given opening is considered the 0° phase and its phase-shifting rim the 180° phase, all adjacent patterns have a phase-shifting rim of the 0° phase and openings of the 180° phase. In this way, each contact formed has an equivalent performance of an isolated rim phase-shifted contact, without suffering the proximity effect described earlier.

Several methods of fabricating the invented mask are disclosed. Each method has one or more advantages. Some methods do not require a chrome undercut etch, which may be unreliable. Some methods are virtually self-aligned, in that no precision alignment steps on an E-beam system are required. Some of the methods do not require unconventional CAD elements such as rim or doughnut shaped features. Some of the methods introduce a 360° phase-shifted region which serves as the 0° phase.

BRIEF DESCRIPTION OF THE DRAWINGS

The present invention is illustrated by way of example and not limitation in the following figures in which:

FIGS. 3A and 3B illustrate the exposure which would result if the pattern of FIG. 1 were placed adjacent to an identical pattern.

FIGS. 4A and 4B illustrate a preferred embodiment of the present invention and the resulting intensity at the photoresist surface.

FIGS. 5A–E illustrate alternate embodiments of the present invention.

FIG. 6 illustrates a further alternate embodiment of the present invention.

FIGS. 7–10 illustrate a method of fanning the reticle of the present invention.

FIGS. 11–15 illustrate an alternate method of forming the reticle of the present invention.

FIGS. 16–20 illustrate a further alternate method of forming the reticle of the present invention.

FIGS. 21–25 illustrate a further alternate method of forming the reticle of the present invention.

FIGS. 26–28 illustrate a further alternate method of forming the reticle of the present invention.

RELATED APPLICATION

Figure 1:
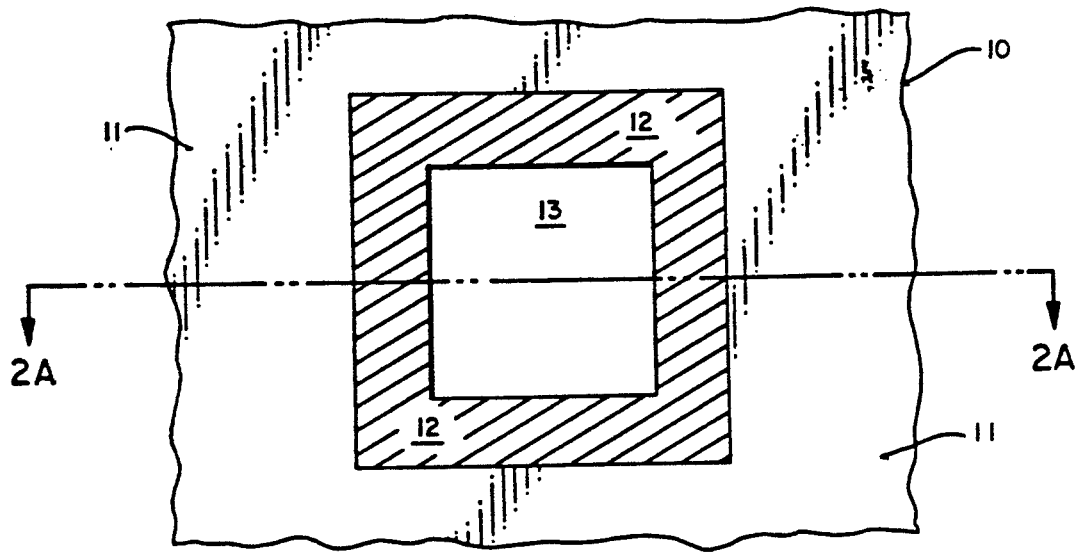
FIG. 1 illustrates a pattern on a prior art phase-shifted reticle.
Figure 2A:
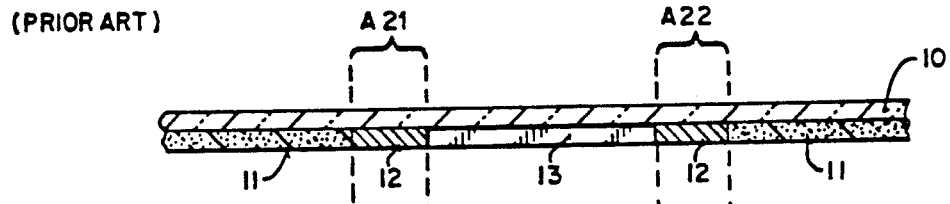
FIGS. 2A–C illustrate the transmitted intensity through the reticle of FIG. 1 and the resultant pattern formed in a positive photoresist layer.
Figure 2B:
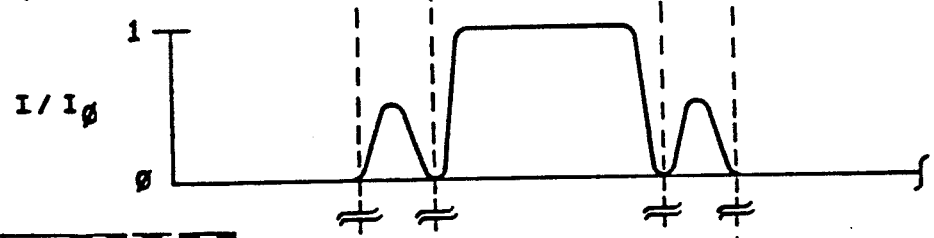
Figure 2C:
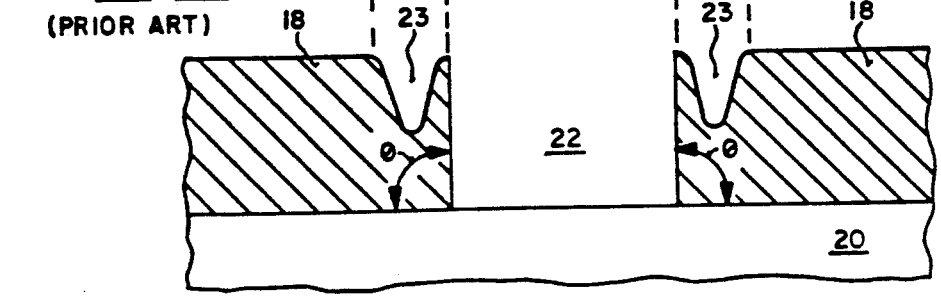

This application is related to co-pending United States Patent application Ser. No. 07/933,341, entitled "Method Of Fabrication Of Inverted Phase-Shifted Reticle," invented by Giang T. Dao, Eng Tsan Gaw, Nelson N. Tam, and Ruben A. Rodriguez, filed concurrently, which application is assigned to the assignee of the present application.

DETAILED DESCRIPTION OF PRESENT INVENTION

An inverted phase-shifted reticle is disclosed. In the following description, numerous specific details are set forth such as specific materials, reticle patterns, dimensions, etc. in order to provide a thorough understanding of the present invention. It will be obvious, however, to one skilled in the art that these specific details need not be employed to practice the present invention. In other instances, well known materials or methods have not been described in detail in order to avoid unnecessarily obscuring the present invention.

A variety of patterned resist layers may be formed. The present invention may be used to pattern a resist layer having dimensions larger or smaller than the conventional resolution limit. The patterned resist layer may be used as a masking layer during a dielectric, silicon, or metal etch step, or as a masking layer during a doping step and at other processing steps. Although the present invention is particularly applicable for reticles having closely spaced features with phase-shifting elements, a large number of patterns can be formed using the present invention. A patterned resist layer may be used for defining contact or via openings, polysilicon word lines, metal lines, field isolation regions, ion implanted regions, etc. Patterns that can be formed by the present invention are not limited to the examples given. The present invention may be used with any semiconductor technology including bipolar, metal-oxide-semiconductor, and III-V semiconductors.

A variety of materials and equipment can be used. The reticle may be made of many different materials. A reticle base or substrate may comprise quartz, glass, silicon, silicon nitride, silicon oxynitride, or boron nitride. Chrome, gold, copper, and other metallic compounds may be used for an opaque element. A polysilicon stencil or "see through" reticle may be used, although the reticle may be more difficult to manufacture. Any material that is opaque to the radiation may be used as an opaque element. In a preferred embodiment, phase-shifting is accomplished through use of regions of different quartz thicknesses as described below. Alteratively, phase-shifting elements may be made by forming regions of other materials in the reticle region where phase-shifting is desired. For example, a phase-shifting element may be made of a material including photoresist, silicon dioxide (doped or undoped), spin-on-glass, polyimide, silicon nitride, silicon oxynitride, and poly(methyl methacrylate).

The present invention may be used with any lithographic printer regardless of radiation wavelength and numerical aperture. Examples of lithographic printers include projection printers, contact printers, and proximity printers. Commercially available lithographic printers typically operate at a wavelength λ, no loner than approximately 436 nm and have a lens with a numerical aperture (NA) in the range of approximately 0.17 through 0.6 and an image reduction factor in the range of approximately 1×1 through 10×1.

In a currently preferred embodiment of the present invention, a semiconductor substrate is coated with a positive photoresist layer and is placed in a lithographic printer. In a currently preferred embodiment, the lithographic printer is a projection printer leaving a radiation source that emits radiation having a wavelength of approximately 365 nm, a lens with a numerical aperture of approximately 0.50 and an image reduction factor of approximately 5×1. The 5×1 image reduction factor means that an image on the reticle is reduced by about five times when the image reaches the surface of the photoresist layer. An example of the projection printer is a Nikon i-line projection printer. As noted above, the image on the reticle is five times larger than the image formed on the photoresist surface. For simplicity, when the radiation intensity at the photoresist surface is discussed in relation to the reticle feature, reference will be made to, for example, the intensity of radiation "under an opening" or "under a phase-shifting element" of the reticle. This terminology is used to describe the intensity of radiation on the photoresist surface at the corresponding 1/5 size image.

FIG. 4 shows a portion of a reticle formed in accordance with a currently preferred embodiment. The reticle comprises quartz plate 20, chrome element 21, and opening patterns 22 and 25. Opening pattern 22 comprises opening 23 and phase-shifting rim 24. Opening pattern 25 comprises opening 26 and phase-shifting rim 27.

As is well known in the art, when light travels through a medium having an index of refraction greater than that of air, its phase is shifted relative to light which has not traveled through the medium. The degree of the phase-shift is dependent upon the index of refraction of the particular material, the wavelength of the light and the thickness of the material. In a preferred embodiment, light from a phase-shifting element is shifted relative to other proximate regions by varying the thickness of the quartz plate 20. For convenience, some regions are referred to as the 0° phase, and other regions are referred to as the 180° phase. It is understood that these phases do not correspond to any absolute phase-shifting through the reticle but only to the relative difference between the two regions. In general, regions which have had no quartz etched or have had a sufficient thickness of quartz etched to shift the phase of radiation an integer multiple of 360°, relative to radiation transmitted through unetched quartz, are referred to as the 0° phase. Regions which have had sufficient quartz etched to shift the phase of radiation 180° or 180° plus an integer multiple of 360° relative to radiation transmitted through unetched quartz are referred to as the 180° phase. The 180° phase regions are denoted by cross hatching in the accompanying Figures. Furthermore, for the phase-shifted reticle to be effective, the phase difference between a phase-shifting element and a proximate or adjacent opening does not need to be exactly 180° but may be anywhere between approximately 160°-200° (or 160°- 200° plus a multiple of 360°) Finally, it will be understood by one skilled in the art that all of the 0° phase regions and all of the 180° phase regions over the entire surface of a reticle do not need to have a phase difference within the range of approximately 160°-200° from one another, but that adjacent 0° and 180° regions should have a phase difference within this range in order to be effective.

Referring again to FIG. 4, opening 23 is the 0° phase while phase-shifting rim 24 is the 180° phase. Thus, an opening of below conventional resolution can be formed by opening pattern 22 by virtue of the phase-shifting rim 24. Similarly, for opening pattern 25, opening 26 is the 180° phase while phase-shifting rim 27 is the 0° phase. Since these two regions are 180° out of phase, a sub-conventional resolution opening can be formed in the photoresist by opening pattern 25.

As described previously, if two prior art opening patterns with a phase-shifting rim were placed adjacent to one another (i.e., no chrome between the patterns) as shown in FIG. 3A, or within approximately 0.55λ/NA of one another, the exposure intensity underneath the phase-shifting rims 12 between openings 13 would be unacceptably high, as shown in FIG. 3B. However this is not the case with the embodiment of the present invention shown in FIG. 4.

Since phase-shifting rim 24 of opening pattern 22 is "inverted" relative to phase-shifting rim 27 of opening pattern 25, the problem of an unacceptably high exposure intensity between two adjacent or closely spaced contact patterns does not occur. Radiation transmitted through phase-shifting rim 24 interferes with radiation transmitted through phase-shifting rim 27, causing the intensity between opening 23 and opening 26 to be low, such that the photoresist between the openings is not significantly exposed. FIG. 4B shows a plot of $I/I_0$ between the points 28 and 28a of FIG. 4A. As can be seen, $I/I_0$ under the openings 23 and 26 is close to unity, while $I/I_0$ under the phase-shifting rims 24 and 27, even where they are adjacent, is close to 0.

Using the reticle of FIG. 4, in a currently preferred embodiment, an opening in the photoresist having a dimension of approximately 0.35- 0.40 microns can be expected, with the printer described previously. To achieve an opening with this dimension, the dimension of openings 23 and 26 is approximately $2.6\mu$ on a 5:1 reticle, and the width of the phase-shifting rims 24 and 27 is approximately $0.85\mu$ (On a 1:1 basis, the dimension of the openings 23 and 26 is approximately $0.52\mu$ and the width of the phase-shifting rim is approximately $0.17\mu$.) For the printer described previously, this corresponds to an opening dimension of approximately 0.7 IRF.$\lambda$/NA and a rim width of approximately 0.25 IRF.$\lambda$/NA. Patterns with different dimensions from those given above can be achieved using the method of the present invention. Additionally, different exposure parameters from those given for IRF, $\lambda$, and NA can be used with a reticle according to the present invention. Generally, the dimension of the opening or other feature to be formed should be approximately 20% larger on the reticle (on a 1:1 basis) than the desired feature size. Also, the width of the phase-shifting rim may be in the range of approximately 0.1-0.4 IRF.$\lambda$/NA. The value of 0.25 IRF.$\lambda$/NA given above has been found to give acceptable resolution and depth of filed, without an unacceptable exposure underneath the phase-shifting rim.

In addition to the pattern shown in FIG. 4, the inverted rim phase-shifted reticle of the present invention can be used to fort-n closely spaced openings in a variety of spatial arrangements as shown in FIGS. 5A-E. Of course, the methods of the present invention can be used for opening patterns having a greater spacing between one another as well. FIG. 5E shows two closely spaced "outrigger" phase-shifted opening patterns 22a and 25a, having openings 23a and 26a, formed in accordance with the present invention. The outriggers, labeled 24a and 27a, are the phase-shifting elements which set up the destructive interference near the opening edge allowing for below conventional resolution. As with the other reticles of FIGS. 4 and 5A, each outrigger opening pattern is inverted with respect to all other patterns proximate to it. In each of FIGS. 5A-C, if intensity is plotted between the points 30 and 30a, 31 and 31a, or 32 and 32a of FIGS. 5A-C, a plot of $I/I_0$ similar to that shown in FIG. 4B is obtained. In FIG. 5D, a plot of $I/I_0$ along a line connecting points 33 and 33a, and along a line connecting points 34 and 34a, would be similar to the plot of FIG. 4B, except that the pattern of FIG. 4B would be repeated 3 and 4 times, respectively. A plot of $I/I_0$ taken along the points 35 and 35a of FIG. 5E would yield a similar pattern, with $I/I_0$ close to 1 under openings 23a and 26a, and $I/I_0$ close to 0 under the phase-shifting outriggers 24a and 27a, under the chrome element 21 between the outriggers and openings (e.g., between the opening 23a and outrigger 24a) and under the chrome between patterns 22a and 25a. Generally, $I/I_0$ beneath the openings of the opening pattern is close to unity, while $I/I_0$ beneath the phase-shifting elements or chrome elements is close to zero.

The methods of the present invention are not limited to the specific rim or outrigger phase-shifting opening patterns shown in FIGS. 4A and 5A-E. The present invention may be used for any patterns having phase-shifting elements which are spaced in close proximity to other such patterns. For example, FIG. 6 shows two closely spaced line patterns 40 and 43 having a dimension less than the conventional resolution limit. The line patterns 40 and 43 could be used to pattern a resist layer in the fabrication of two closely spaced interconnection lines, for example.

FIGS. 7-28 show several alternate methods of the fabrication of a reticle having the pattern shown in FIG. 5A. In the following methods, the pattern of FIG. 5A is used for illustration. It will be obvious, however, that the methods described below could be used to fabricate any of the patterns of FIGS. 4A, 5A-E and 6, as well as any other pattern within the scope of the present invention. Also, regions having the 0° phase (or a 360° phase or multiple thereof) are described in reference to opening 23 and rim 27, while regions having the 180° phase (or 180° plus a multiple of 360°) are described in reference to opening 26 and rim 24. However, it is understood that such references are relative and the positioning of openings and phase-shifting rims need only be such that adjacent regions are approximately 160°-200° (or 160°-200° plus a multiple of 360°) out of phase as described earlier. In this regard, although each substrate etch is described as carried out such that a thickness of the substrate sufficient to shift radiation approximately 160°-200° is removed, it will be appreciated that the thickness referred to in the following description and appended claims is a thickness sufficient to shift radiation approximately 160°-200° plus n*360°, where n is an integer of 0 or greater. In a preferred embodiment, the reticle is formed on a quartz substrate having a chrome layer thereon. In the etch steps described below, the quartz is etched in a dry plasma etch and the chrome is etched in a wet chemical etch. The chrome and quartz etches are performed by methods well known in the art. It will be obvious, however, that the methods could be used to fabricate a reticle according to the present invention on other substrates having other opaque layers, such as those described earlier, using well known methods to etch the selected materials.

Referring to FIG. 7, the quartz plate 20 and chrome layer 21 have patterning layer 51 with openings 52 formed therein. Some of the openings 52 expose a region corresponding to a phase-shift rim (left side of FIG. 7) while others expose a region corresponding to an opening (right side of FIG. 7). The structure of FIG. 7 is then subjected to a chrome etch and then a quartz etch by methods well known in the art to remove the chrome and a portion of quartz plate 20 in the region exposed by opening 52. The quartz etch is designed to remove a thickness of quartz sufficient to shift radiation of wavelength $\lambda$ 160°-200°. The thickness of glass to be removed is an amount equal to approximately:

$$\frac{x \cdot \lambda}{2(n-1)}$$

where x is an odd numbered integer, $\lambda$ is the wavelength of the exposing radiation, and n is the index of refraction of quartz plate 20 at wavelength $\lambda$.

FIG. 8 shows the structure of FIG. 7 after the chrome and glass etches, and after the removal of photoresist layer 51.

Next, patterning layer 61, having openings 62, is formed on the structure of FIG. 8 as shown in FIG. 9. Patterning layer 61 must be precisely aligned to ensure, for example, that phase-shifting rim 27 is centered about opening 26. Note that the left opening 62 of FIG. 9 is slightly smaller than the right opening 62, in order to allow for greater misalignment tolerance on those openings 62 which expose the chrome over regions corresponding to openings 23. A chrome etch is then performed to remove the chrome in the region exposed by openings 62. After removal of patterning layer 61, the reticle appears as shown in FIG. 10, which shows a cross-sectional view of the pattern shown in FIG. 5A. Opening pattern 22, having phase-shifting rim 24 and opening 23, and opening pattern 25 having phase-shifting rim 27 and opening 26, with chrome element 21 between the two patterns, is shown.

As an alternative to the order of steps shown in FIGS. 7-10, the patterning layer 61 with openings 62 can be formed on quartz substrate 20 and chrome layer 21 first, followed by a chrome etch to remove the chrome in the regions exposed by openings 62. If this alternative order is used, then, contrary to the previous method, both the left and right openings 62 shown in FIG. 9 must be equal in size to the opening and phase-shifting rim combined. Next, after removal of patterning layer 61, patterning layer 51 with openings 52 can be formed, followed by a quartz etch to produce the phase shifting regions. After removal of patterning layer 51, the reticle will again appear as shown in FIG. 10.

Note that the method shown in FIGS. 7-10, as well as the alternate order described in the preceding paragraph, does not require a chrome undercut etch (described below in conjunction with FIG. 19), often used in fabrication of phase-shifted reticles. The chrome undercut etch has various reliability problems, such as poor resist adhesion, leading to unintended removal of chrome.

FIGS. 11-15 illustrate an alternate method of fabricating the inverted phase-shifted reticle of the present invention. First, quartz substrate 20 having chrome layer 21 is patterned with a patterning layer 70, having openings 71. Openings 71 correspond to the locations of, for example, the phase-shifting rims of two adjacent contact patterns 22 and 25. A chrome etch is then performed to remove the chrome from the regions exposed by openings 7 1, followed by a quartz etch designed to remove a thickness of quartz substrate 20 sufficient to shift the phase of transmitted radiation approximately 160°-200°. The resulting structure is shown in FIG. 11.

Next patterning layer 70 is removed followed by another patterning layer 75 having openings 76, exposing for example, the chrome overlying the locations the contact openings 23 and 26, as shown in FIG. 12. A chrome etch is then performed, followed by removal of patterning layer 75, resulting in the structure shown in FIG. 13.

A third patterning layer 80 with opening 81 is then formed, as shown in FIG. 14. Opening 81 exposes opening 26 and phase-shifting rim 27.

A quartz etch is then performed on the structure of FIG. 14. This etch removes a thickness quartz substrate 20 from the regions exposed by opening 81 sufficient to shift the phase of transmitted radiation approximately 160°-200°. After removal of masking layer 80, the reticle appears as shown in FIG. 15. The portion of the reticle shown in FIG. 15 could be, for example, the patterns shown in FIG. 5A. In FIG. 15, if opening 23 is the 0° phase, rim 24 is the 180° phase, rim 27 is the 360° phase (since this region was exposed to two quartz etches) and opening 26 is the 180° phase.

Note that the method shown in FIGS. 11-15 is virtually self-aligned. That is, after the initial patterning of masking layer 70 of FIG. 11, all further chrome and quartz etch steps are automatically aligned to the pattern of FIG. 11, with only coarse alignment of patterning layers 75 or 80. There is no need for precision alignment methods to ensure alignment of a phase-shifting rim to its corresponding opening, for example. Additionally the method of FIGS. 11-15 avoid a chrome undercut etch.

FIGS. 16-20 illustrate a further alternate method of fabricating the inverted phase-shifted reticle of the present invention. First, quartz substrate 20 with chrome layer 21 is covered with sacrificial layer 90 and patterning layer 91. Sacrificial layer 90 can be any organic or inorganic layer which has a lower etch rate than the substrate and opaque layer in the respective etches of these materials. In a preferred embodiment, sacrificial layer 90 is made of silicon nitride ($Si_3N_4$). Alternatively, sacrificial layer 90 could be, for example, highly doped silicon dioxide, silicon oxynitride ($Si_xO_yN_z$) or any of a variety of organic materials such as polyimide, paralyne, fluoropolymer, or photoresist, for example. Sacrificial layer 90 should be a material which can be selectively etched from the reticle substrate 20. After quartz substrate 20 has been covered with sacrificial layer 90 and patterning layer 91, openings 92 are formed in patterning layer 91 as shown in FIG. 16. Next, sacrificial layer 90 is etched by well known methods, followed by an etch of chrome layer 21 and then an etch of quartz substrate 20. Again, a sufficient thickness of quartz substrate 20 is etched to phase-shift radiation approximately 160°-200°. The resulting structure is shown in FIG. 16. The etched regions correspond to opening 26 and rim 24 of FIG. 5A.

Referring to FIG. 17, after removal of patterning layer 91 of FIG. 16, patterning layer 95 with opening 96 is formed on the reticle surface. Opening 96 exposes, for example, opening 23 of FIG. 5A. Next, the sacrificial layer 90 and chrome layer 21 are removed by etching in the region exposed by opening 96.

After the above described etch, removal of patterning layer 95, and formation of patterning layer 100 with opening 101, the reticle appears as shown in FIG. 18. Opening 101 exposes the region corresponding to opening 26 and rim 27 of FIG. 5A. Note that due to the presence of sacrificial layer 90, the dimension and alignment of opening 101 is not critical. That is, opening 101 does not need to be precisely the same size as the combined opening 26 and rim 27, and does not need to be precisely aligned about the previously etched region of quartz substrate 20 which it exposes.

Next, a chrome undercut etch is performed to remove the chrome from the region corresponding to rim 24. The chrome undercut etch is performed for a sufficient time to allow the chrome underlying sacrificial layer 90 in the region exposed by opening 101 to be etched inward a sufficient distance to form a phase-shifting rim 24 having the desired width. After the chrome undercut etch, the reticle appears as shown in FIG. 19. Next, the sacrificial layer 90 is removed, resulting in the reticle shown in FIG. 20, having the pattern shown in FIG. 5A. (Except that opening pattern 22, having opening 23 of the 0° phase and rim 24 of the 180° phase, is on the right in FIG. 20.)

As with the previous method, the method illustrated in FIGS. 16–20 is virtually self-aligned, thereby avoiding E-beam alignment error and leading to better lithographic performance when used to pattern a photoresist layer.

FIGS. 21–25 illustrate a further alternate method of fabricating the inverted phase-shifted reticle of the present invention. First, as shown in FIG. 21, patterning layer 110 with openings 111 is formed on quartz substrate 20 and chrome layer 21. The openings 111 correspond to the openings 23 and 26 of FIG. 5A.

Next, a chrome undercut etch is performed as shown in FIG. 22. The regions 112 where chrome is removed in the undercut etch correspond to rims 24 and 27 of FIG. 5A. Referring to FIG. 23, a quartz etch is performed to remove a thickness of quartz substrate 20 sufficient to phase-shift radiation 180°. In this etch, quartz is removed from the region directly underlying openings 111, but not from the regions underlying region 112, since the dry etch is anisotropic.

Next, patterning layer 110 is removed, followed by patterning layer 115 having opening 116 as shown in FIG. 24. The structure of FIG. 24 is then subjected to a quartz etch to remove a thickness of quartz sufficient to phase-shift radiation 160°–200° from all regions exposed by opening 116. The resulting structure is shown in FIG. 25. For a reticle fabricated by the method described in conjunction with FIGS. 21–25, opening 23 is the 360° phase, similar to rim 27 of FIG. 15.

As can be seen from FIGS. 21–25 and the above description, the method of FIGS. 21–25 does not require that a rim-shaped opening, which is not a conventional CAD pattern, be formed. Furthermore, as with the two prior methods, the method of FIGS. 21–25 is virtually self-aligned.

A further alternative method to fabricate the reticle of the present invention is illustrated in FIGS. 26–28 and FIGS. 24–25. First, as shown in FIG. 26, a patterning layer 120 with openings 121 is formed on quartz substrate 20 and chrome layer 21. The openings 121 expose the regions corresponding to openings 23 and 26 and rims 24 and 27 of FIG. 5A. Next, a chrome etch is performed to remove the chrome from the regions exposed by openings 121. The resulting structure is shown in FIG. 26. Next, patterning layer 120 is removed and patterning layer 125 with openings 126 is formed as shown in FIG. 27. The openings 126 expose the region corresponding to openings 23 and 26. Note that in this embodiment, the second patterning layer 125 must be precisely aligned so that openings 126 are centered in the chrome openings formed in the preceding chrome etch. Next, a quartz etch is performed to remove a thickness of quartz sufficient to phase-shift radiation approximately 160–°200°. The resulting structure is shown in FIG. 28. After removal of patterning layer 125, the structure of FIG. 28 is processed as described above in conjunction with FIGS. 24 and 25. While the embodiment shown in FIGS. 26–28 and 24–25 is not self-aligned, it does not require the chrome undercut etch as in the embodiment shown in FIGS. 21–25. As with the previous method, the embodiment shown in FIGS. 26–28 does not require unconventional CAD features.

Thus, an inverted phase-shifted reticle with closely spaced patterns, capable of forming below conventional resolution features without unacceptable exposure between the closely spaced features, has been described.

Several methods of fabrication of a reticle according to the present invention are also disclosed.

What is claimed is:

1. A reticle for use in patterning a radiation sensitive layer on a lithographic printer having a numerical aperture (NA), an image reduction factor (IRF) and an exposing radiation wavelength ($\lambda$), comprising:

a first region, said first region transmitting at least a portion of radiation incident thereon;

a second region proximate said first region, said second region comprising a phase-shifting element for said first region, said second region transmitting at least a portion of radiation incident thereon, wherein radiation transmitted through said second region is phase shifted approximately 160–200 degrees relative to radiation transmitted through said first region;

a third region disposed within approximately 0.55 IRF *$\lambda$/NA of said second region, said third region transmitting at least a portion of radiation incident thereon, wherein radiation transmitted through said third region is phase shifted approximately 160–200 degrees relative to said second region; and, a fourth region proximate said third region, said fourth region transmitting at least a portion of radiation incident thereon, wherein said third region comprises a phase-shifting element for said fourth region, and wherein radiation transmitted through said fourth region is phase shifted approximately 160–200 degrees relative to said third region.

2. The reticle as described in claim 1 wherein said first region is adjacent to said second region, said second region is adjacent to said third region, and said third region is adjacent to said fourth region.

3. The reticle as described in claim 1 wherein said first region is adjacent to said second region, said third region is adjacent to said fourth region, and said reticle further comprises an opaque region between said second region and said third region.

4. The reticle as described in claim 1 wherein said second region and said third region have a dimension in the range of approximately 0.1–0.4 IRF *$\lambda$/NA.

5. A reticle for use in patterning a radiation sensitive layer on a lithographic printer having a numerical aperture (NA), an image reduction factor (IRF) and an exposing radiation wavelength ($\lambda$), comprising:

a first pattern, said first pattern having a first region and a second region proximate said first region, said first region and said second region transmitting at least a portion of radiation incident thereon, said second region comprising a phase shifted approximately 160–200 degrees relative to radiation transmitted through said first region;

a second pattern disposed within approximately 0.55 IRF *$\lambda$/NA of said first pattern, said second pattern having a third region and a fourth region proximate said third region, said third region and said fourth region transmitting at least a portion of radiation incident thereon, said third region comprising a phase-shifting element for said fourth region, wherein said third region lies between said fourth region and said first pattern, and wherein radiation transmitted through said third region is phase shifted approximately 160–200 degrees relative to said second region and radiation transmitted through said fourth region is shifted approximately 160–200 degrees relative to said third region.

6. The reticle as described in claim 5 wherein said first pattern and said second pattern are opening patterns, wherein said second region of said first pattern surrounds said first region of said first pattern and said third region of said second pattern surrounds said fourth region of said second pattern.

7. The reticle as described in claim 6 wherein said first and said second patterns form corresponding patterns in said radiation sensitive layer, said corresponding patterns having a dimension of 0.5 micron or less.

8. The reticle as described in claim 6 wherein an opaque region lies between said first pattern and said second pattern.

9. The reticle as described in claim 5 comprising a plurality of said first patterns and said second patterns, wherein none of said first patterns is disposed at a distance of approximately 0.55 IRF *λ/NA or less from another of said first patterns and none of said second patterns is disposed at said distance from another of said second patterns.

10. The reticle as described in claim 5 wherein said first and said second patterns form corresponding patterns in said radiation sensitive layer, said corresponding patterns having a dimension of 0.5 microns or less.

11. The reticle as described in claim 5, wherein said first pattern and said second pattern are line patterns.

12. The reticle as described in claim 11 wherein said first and said second patterns form corresponding patterns in said radiation sensitive layer, said corresponding patterns having a dimension of 0.5 microns or less.

13. The reticle as described in claim 5 wherein said second region and said third region have a dimension in the range of approximately 0.1–0.4 IRF *λ/NA.

14. A method of patterning a radiation sensitive layer comprising the steps of:
   providing a substrate having said radiation sensitive layer;
   exposing said radiation sensitive layer on a lithographic printer having a numerical aperture (NA), an image reduction factor (IRF) and an exposing radiation wavelength (λ), using a reticle comprising:
   a first region, said first region transmitting at least a portion of radiation incident thereon;
   a second region proximate said first region, said second region comprising a phase-shifting element for said first region, said second region transmitting at least a portion of radiation incident thereon, wherein radiation transmitted through said second region is phase shifted approximately 160–200 degrees relative to radiation transmitted through said first region;
   a third region disposed within approximately 0.55 IRF *λ/NA of said second region, said third region transmitting at least a portion of radiation incident thereon, wherein radiation transmitted through said third region is phase shifted approximately 160–200 degrees relative to said second region; and,
   a fourth region proximate said third region, said fourth region transmitting at least a portion of radiation incident thereon, wherein said third region comprises a phase-shifting element for said fourth region, and wherein radiation transmitted through said fourth region is phase shifted approximately 160–200 degrees relative to said third region.

15. The method as described in claim 14 wherein said first region is adjacent to said second region, said second region is adjacent to said third region, and said third region is adjacent to said fourth region.

16. The method as described in claim 14 wherein said first region is adjacent to said second region, said third region is adjacent to said fourth region, and wherein a portion of said radiation sensitive layer is exposed to substantially no radiation in a fifth region between said second and said third regions.

17. The method as described in claim 14 wherein two opening patterns are formed in said radiation sensitive layer by said method.

18. The method as described in claim 14 wherein said opening patterns have a dimension of 0.5 micron or less.

19. The method as described in claim 14 wherein two line patterns are formed in said radiation sensitive layer by said method.

20. The method as described in claim 19 wherein said line patterns have a dimension of 0.5 micron or less.

21. The method as described in claim 14 wherein said second region and said third region have a dimension in the range of approximately 0.1–0.4 IRF *λ/NA.

* * * * *

UNITED STATES PATENT AND TRADEMARK OFFICE
CERTIFICATE OF CORRECTION

PATENT NO. : 5,302,477
DATED : 4/12/94
INVENTOR(S) : Giang T. Dao, Ruben A. Rodriguez, Harry H. Fujimoto It is certified that error appears in the above-indentified patent and that said Letters Patent is hereby corrected as shown below:

Column 4; Line 34; Delete "fanning"; Insert in place thereof --forming--
Column 5; Line 40; Delete ", no loner"; Insert in place thereof --no longer--
Column 5; Line 49; Delete "leaving"; Insert in place thereof --having--
Column 7; Line 31; Delete "filed"; Insert in place thereof --field--

Signed and Sealed this

Third Day of October, 1995

Attest:

BRUCE LEHMAN

*Attesting Officer*   *Commissioner of Patents and Trademarks*